(12) United States Patent
Benameur et al.

(10) Patent No.: US 11,370,710 B2
(45) Date of Patent: Jun. 28, 2022

(54) DENSE SINTERED PRODUCT

(71) Applicant: Apple Inc., Cupertino, CA (US)

(72) Inventors: Nassira Benameur, Jonquières (FR); Christian His, Cavaillon (FR); Jérôme Leloup, le Thor (FR)

(73) Assignee: Apple Inc., Cupertino, CA (US)

(*) Notice: Subject to any disclaimer, the term of this patent is extended or adjusted under 35 U.S.C. 154(b) by 378 days.

(21) Appl. No.: 15/884,269

(22) Filed: Jan. 30, 2018

(65) Prior Publication Data

US 2018/0215667 A1 Aug. 2, 2018

(30) Foreign Application Priority Data

Jan. 31, 2017 (FR) .................................. 1750812

(51) Int. Cl.
*C04B 35/117* (2006.01)
*C04B 35/645* (2006.01)
(Continued)

(52) U.S. Cl.
CPC ........... *C04B 35/117* (2013.01); *C04B 35/111* (2013.01); *C04B 35/6261* (2013.01);
(Continued)

(58) Field of Classification Search
CPC .............................. C04B 35/117; C04B 35/111
See application file for complete search history.

(56) References Cited

U.S. PATENT DOCUMENTS

| | | | | |
|---|---|---|---|---|
| 4,582,813 A | * | 4/1986 | Kanda | C04B 35/111 501/128 |
| 4,601,991 A | * | 7/1986 | Ando | C04B 35/111 501/153 |

(Continued)

FOREIGN PATENT DOCUMENTS

| | | |
|---|---|---|
| FR | 2999194 | 6/2014 |
| FR | 3028510 | 5/2016 |

(Continued)

OTHER PUBLICATIONS

Bai, H., Chen, Y., Delattre, B., Tomsia, A.P. and Ritchie, R.O., 2015. Bioinspired large-scale aligned porous materials assembled with dual temperature gradients. Science advances, 1(11), p. e1500849. (Year: 2015).*

(Continued)

*Primary Examiner* — Nicholas R Krasnow
(74) *Attorney, Agent, or Firm* — Dorsey & Whitney LLP

(57) ABSTRACT

Sintered product
  having a chemical analysis such that, in mass percentages:
    $SiO_2$ content is greater than 0.2% and less than 2%, and
    CaO content is greater than 0.1% and less than 1.5%, and
    MgO content is less than 0.3%, and
    alumina and other elements being the complement at 100%, the content of other elements being less than 1.5%,
  having a relative density greater than 90%,
  comprising, for more than 90% of its volume, a stack of ceramic platelets (10) laid flat, all of said platelets having an average thickness less than 3 μm, more than 95% by number of said platelets each containing more than 95% by mass of alumina,
  having a width (l) greater than 81 mm.

11 Claims, 3 Drawing Sheets

(51) Int. Cl.
*C04B 35/111* (2006.01)
*C04B 35/64* (2006.01)
*C04B 35/626* (2006.01)
*C04B 37/04* (2006.01)
*H05K 5/00* (2006.01)
*H05K 5/03* (2006.01)

(52) U.S. Cl.
CPC .. *C04B 35/62625* (2013.01); *C04B 35/62645* (2013.01); *C04B 35/62655* (2013.01); *C04B 35/64* (2013.01); *C04B 35/645* (2013.01); *C04B 37/042* (2013.01); *H05K 5/0086* (2013.01); *H05K 5/03* (2013.01); *C04B 2235/3206* (2013.01); *C04B 2235/3208* (2013.01); *C04B 2235/3217* (2013.01); *C04B 2235/3244* (2013.01); *C04B 2235/3246* (2013.01); *C04B 2235/3418* (2013.01); *C04B 2235/36* (2013.01); *C04B 2235/386* (2013.01); *C04B 2235/5292* (2013.01); *C04B 2235/5296* (2013.01); *C04B 2235/5409* (2013.01); *C04B 2235/5418* (2013.01); *C04B 2235/5427* (2013.01); *C04B 2235/5436* (2013.01); *C04B 2235/5445* (2013.01); *C04B 2235/5463* (2013.01); *C04B 2235/604* (2013.01); *C04B 2235/606* (2013.01); *C04B 2235/6021* (2013.01); *C04B 2235/6022* (2013.01); *C04B 2235/612* (2013.01); *C04B 2235/77* (2013.01); *C04B 2237/30* (2013.01); *C04B 2237/343* (2013.01)

(56) References Cited

U.S. PATENT DOCUMENTS

| | | | | |
|---|---|---|---|---|
| 4,720,471 | A | * | 1/1988 | Ando .................... C04B 35/111 |
| | | | | 501/136 |
| 5,047,182 | A | * | 9/1991 | Sundback ................. B22F 3/22 |
| | | | | 264/28 |
| 2004/0239717 | A1 | * | 12/2004 | Higa ..................... B41J 2/1603 |
| | | | | 347/20 |
| 2011/0077141 | A1 | * | 3/2011 | Walker .................. C04B 35/111 |
| | | | | 501/32 |
| 2015/0329431 | A1 | * | 11/2015 | Deville .................. B28B 1/007 |
| | | | | 264/28 |

FOREIGN PATENT DOCUMENTS

| | | |
|---|---|---|
| JP | 2005306635 A * | 11/2005 |
| JP | WO2014/087382 | 6/2014 |
| JP | WO2015/189659 | 12/2015 |

OTHER PUBLICATIONS

Suarez, G. et al., "Effect of starting powders on the sintering of nanostructured $ZrO_2$ ceramics by colloidal processing", Science and Technology of Advanced Materials, vol. 10, Jul. 10, 2009, 8 pp.

* cited by examiner

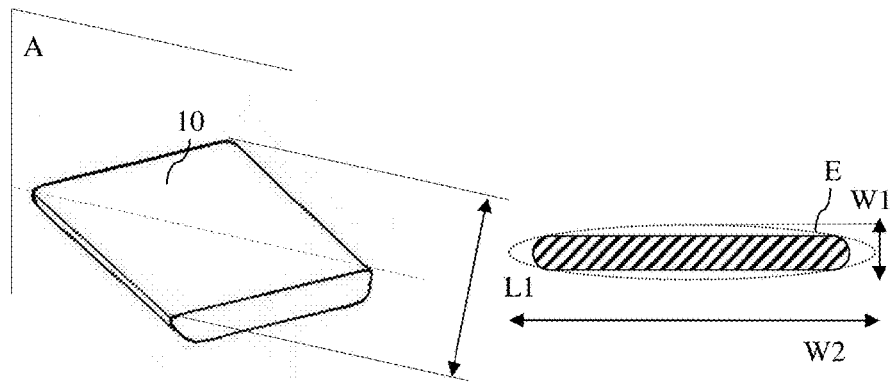
Fig. 1a    Fig. 1b
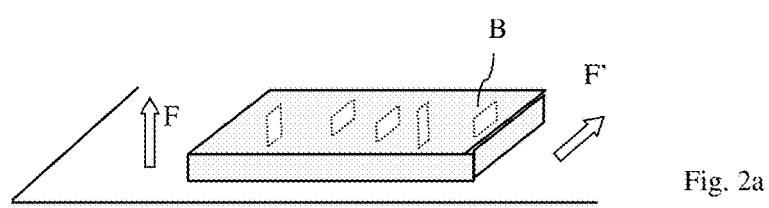
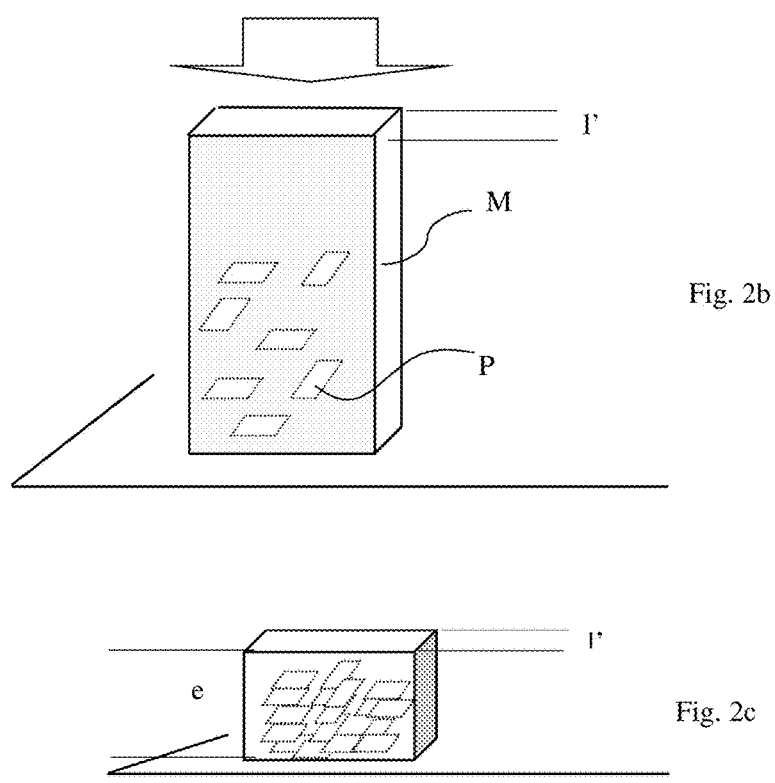
Fig. 2a
Fig. 2b
Fig. 2c
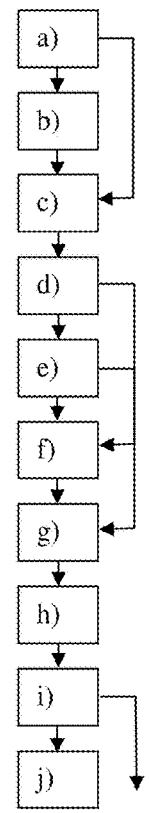
Fig. 3

DENSE SINTERED PRODUCT

CROSS-REFERENCE TO RELATED APPLICATION(S)

This application claims the benefit of French Patent Application No. 1750812, filed Jan. 31, 2017 and titled "Produit Fritté Dense," the disclosure of which is incorporated herein by reference in its entirety.

FIELD

Embodiments are directed to a dense sintered product suitable for use as an electronic device housing, as well as methods for manufacturing the same.

BACKGROUND

WO2015189659 describes a process for manufacturing a dense product, obtained using a process involving an operation of oriented freezing of a slip containing ceramic platelets, then a compression operation. More precisely, the freezing results from the presence of two temperature gradients, F and F' (see FIGS. 2a-2c), oriented perpendicularly to the surface of a slip layer B, poured over a horizontal surface. This process orients the platelets P parallel to one another and approximately perpendicular to the horizontal surface. Elimination of the ice crystals yields a macroporous pre-form M. The pre-form is then compressed in a direction perpendicular to the general layout of the platelets before being sintered. The sintered product that is obtained is dense and offers good mechanical properties, and particularly good toughness. Its smallest dimension, i.e., its thickness e', is typically measured in the direction of the pressure.

However, the process implemented in WO2015189659 does not yield products of a width greater than 50 mm. In fact, the freezing requires that the slip layer laid out horizontally be thin, and specifically less than 50 mm Pressure is therefore applied in a direction parallel to the general orientation of this layer. The width of the resulting product, measured (like length) parallel to the platelets, is then approximately equal to the thickness of the slip layer and is thus limited. The dimension l' represented in FIG. 2b illustrates this problem.

There is a need for a sintered product that does not demonstrate fragility, i.e., such that the Kjc toughness exceeds the K1c toughness, with said tenacities being determined by the SENB ("Single-Edge Notched Beam") method, and preferably having similar tenacities, e.g., greater than that of the WO2015189659 products, but of a width greater than 50 mm.

SUMMARY

One embodiment takes the form of a process for manufacturing a sintered product, including the operations of:
a) preparation of a slip containing a set of ceramic particles in liquid suspension, all of the ceramic particles representing over 90% of the volume of the particles in suspension, and containing:
   a first particulate fraction consisting of platelets of a length greater than or equal to 1 µm and preferably less than 70 µcm, the first particulate fraction having a median length of $L1_{50}$ and representing over 80% of the ceramic particles, as a volume percentage based on all the ceramic particles, with over 50% by volume of said platelets each containing over 50% alumina by mass; and
   a second particulate fraction of particles of a length under 1 µm, the second particulate fraction having a median length of $D_{50}$ at least ten times less than $L1_{50}$ (i.e., $D_{50} < L1_{50}/10$) and representing over 1% of the ceramic particles, as a volume percentage based on all the ceramic particles, with the particles of said second particulate fraction consisting of over 90% oxides by mass;
b) optionally, the elimination of air bubbles contained in the slip,
c) freezing of the slip in such a way as to form a frozen slip incorporating ice crystals;
d) elimination of the ice crystals, preferably by lyophilization, to obtain an intermediary product, and potential drying of said intermediary product;
e) if the intermediary product is not in the form of a powder whose particles pass through a sieve with square grids of 25 mm per side, grinding and/or sieving said intermediary product in order for it to take the form of such a powder;
f) optionally, debinding of said intermediary product;
g) optionally, thermal pre-treatment;
h) shaping of the intermediary product by pressure, injection molding or extrusion to obtain a pre-form;
i) sintering of the pre-form by applying pressure greater than 0.5 MPa to obtain a sintered product, operations h) and i) may be carried out in a single operation;
j) optionally, machining of said sintered product.

As shall be seen in greater detail in the description below, processes described herein allow for the manufacturing of a particularly dense sintered product, presenting non-fragile behavior in the SENB method, and having substantially large dimensions, particularly width.

Some sample embodiments yield, or take the form of, a powder of particles made of pieces of the intermediary product and therefore primarily consisting of agglomerate platelets. In some embodiments, even if the platelets do not have a favorable orientation, the platelets may be oriented by freezing/thawing, sintering, and by applying pressure greater than 0.5 MPa to yield a sintered product in which the platelets are approximately parallel to one another. Thus, it may not be necessary to keep all the platelets parallel to one another from the freezing operation to the pressing operation. Moreover, even if the platelets are aligned, directional pressing may not be required to form the sintered product. Further, embodiments do not require that the frozen suspension be in a thin layer to form the sintered product.

The sintered product may effectively be of any length, width or thickness, including greater than 50 mm or greater than 80 mm or greater than 81 mm.

Another embodiment takes the form of a sintered product: with a relative density greater than 90%, preferably crack initiation toughness K1c greater than 5.5 MPa·m$^{1/2}$, and preferably Kjc toughness greater than 7 MPa·m$^{1/2}$, with over 90% of its volume consisting of stacked ceramic platelets, all of them having average thickness of less than 3 µm, over 95% of said platelets, by number, each contain over 95% of alumina by mass; with a width greater than 81 mm; and with a chemical analysis such that, by percentage of mass: SiO$_2$ content is greater than 0.2% and less than 2%; and CaO content is greater than 0.1% and less than 1.5%; and MgO content is less than 0.3%; and alumina and other elements being the complement at 100%, with the content of other elements being less than 1.5%.

In certain embodiments, the thickness (W1) of a platelet is the length of the short axis of the ellipsis (E) of the minimum space in which the median cross section may be recorded for that platelet, said median cross section being a section of a cut diagram (A) perpendicular to the direction of the length (L1) of said platelet and cutting said platelet at mid-length, said length being the largest dimension of said platelet observable on a picture taken in a direction perpendicular to the platelet lying flat. The width (l) of the product may be the largest dimension measured in the layout (C) in which the product length is measured, following a direction perpendicular to the direction of said length. The length (L) of said product may be its largest dimension in a layout (C) parallel to the general layout on which the platelets are spread.

In some embodiments, the product also presents one or more of the following optional characteristics: crack initiation toughness K1c greater than 6 MPa·m$^{1/2}$, toughness Kjc greater than 8 MPa·m$^{1/2}$; a relative density greater than 95%, and in some embodiments greater than 98%; an average platelet thickness of less than 2.0 µm, and in some embodiments less than 1.5 µm; a width greater than 100 mm, and in some embodiments greater than 150 mm; over 90% of platelets, by number, presenting a length less than 70 µm and greater than 2 µm; an SiO$_2$ content of less than 1.5%, by percentage of mass; a CaO+MgO content of less than 0.8%, by percentage of mass; and a content of other elements of less than 0.8%.

Sample embodiments may also take the form of a sintered product obtained or likely to have been obtained by a process or method as described herein, the dimensions of the pre-form and the first and second particulate fractions being chosen in order for the sintered product obtained upon completion of operation i) to be consistent with the embodiments described herein.

Sample embodiments may also take the form an electronic device including a housing and an electronic system installed in said housing, said housing consisting at least in part of a sintered product as described herein, or obtained through a process as described herein. In some embodiments, the electronic device also includes a cover glass. The cover glass may be formed from chemically-strengthened glass, sapphire, plastic, or any other suitable material. In many embodiments the electronic device is one of a portable computer device, a wearable device, a mobile telephone, a computer keyboard, a computer mouse, a computer tablet, a portable computer, a desktop computer, a multimedia reader, a touch-command device and a virtual reality device.

BRIEF DESCRIPTION OF THE DRAWINGS

FIGS. 1a-1b diagrammatically represent a platelet;
FIGS. 2a-2c illustrate a process consistent with the above technique;
FIG. 3 illustrates a sample sintered product.

Figure 4:
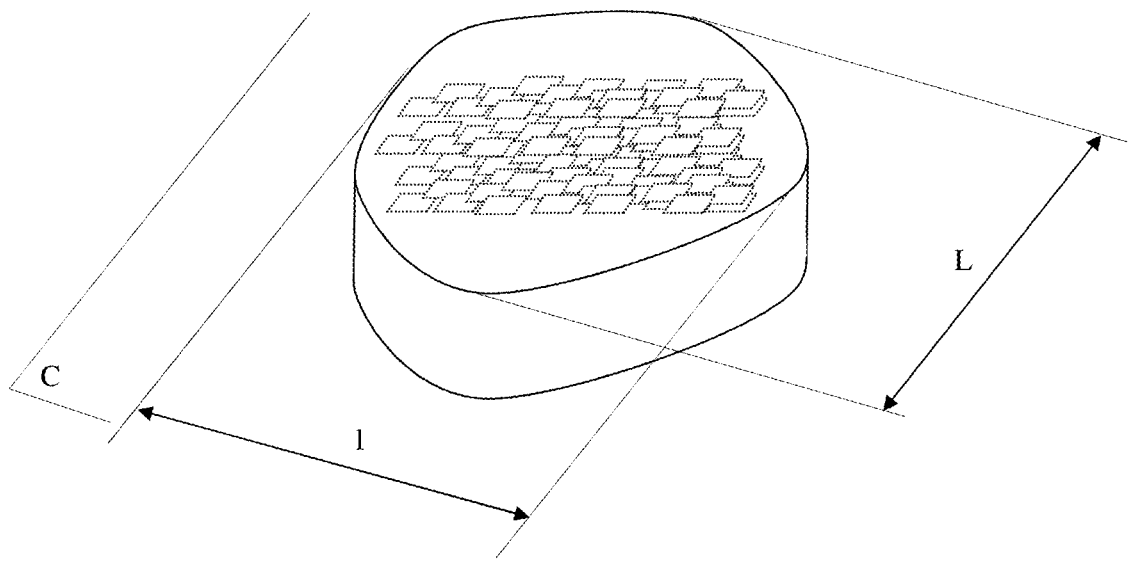
FIG. 4 illustrates another sample sintered product.

In the figures, identical references are used to designate identical or similar objects.

DESCRIPTION

Definitions

"Ceramic material" refers to any non-metallic, non-organic material.

A "precursor" of an element refers to an object that is converted into said element.

"Sublimation" refers to an operation, generally in a vacuum, that consists of evaporating the ice without causing it to melt.

"Melting" refers to an operation that consists of melting the ice.

"Temporary" means "removed from the product during debinding or sintering."

"Particles" refers to the solid elements comprising a powder or suspension in a slip. In a solution, the dissolved material therefore does not consist of particles. The structure of a gel, obtained by gelification of a solution, contains no significant particles. In a sintered product, by extension, this document also refers to "particles" as the agglomerate particles during sintering that were in suspension in the slip used to manufacture the sintered product. The dimensional features corresponding to a platelet in a sintered product may be assessed by measuring said product.

The "length" L1 of a platelet is its largest observable dimension on a picture taken in a direction perpendicular to said platelet when lying flat The "width" W2 and "thickness" W1 of a platelet are the lengths of the large and small axes, respectively, of the smallest possible ellipse E (i.e., the minimum space) in which the median cross section of said platelet can be recorded (i.e., in cut diagram A in FIG. 1).

It should be understood that multiple "preferable" ranges, dimensions, comparisons, conditions, operations, or other lists or statements using the terms "preferable", "preferably" or the like are intended to show varying scopes and not to indicate preferred embodiments or particularly desired limitations. Accordingly, in such lists or statements, it should be understood that multiple "preferable," or "preferred" elements may be given, each of which is separate from the other elements in the list, statement, or the like.

FIG. 1 represents the diagram of a platelet 10. In FIG. 1a, platelet 10 is shown in perspective. FIG. 1b represents the section of platelet 10 following the median cross-section layout A (perpendicular to the direction of Length L1, passing at mid-length of the platelet).

A particle presents a "platelet" shape if it meets the following two conditions:
1) $4 \leq L1/W1$, and
2) $W2 \geq 1.5\ W1$, preferably $W2 \geq 2\ W1$, preferably $W2 \geq 3\ W1$, preferably $W2 \geq 4\ W1$, preferably $W2 \geq 5\ W1$, preferably $W2 \geq 7\ W1$, and/or preferably $W2 \geq 9\ W1$.

In some embodiments, the cross section of a platelet is approximately polygonal and contains at least 4 sides. Also in some embodiments, the large surfaces of a platelet are approximately flat, and in some embodiments parallel to one another.

The dimensions of a platelet may be easily evaluated on pictures of observations made on a powder.

It is also possible to estimate the dimensions of platelets based on observation of surfaces obtained by product fracture, in layouts containing the large surfaces of said platelets and in the layouts perpendicular to said large surfaces.

The "median" value of a property of the particles from a set of particles is the value of said property that divides the particles of said set into first and second populations that are equal in number, said first and second populations containing only particles of a value for said property greater than or equal to, or less than, respectively, the median value. For example, the median length of a set of particles is the length dividing the particles into first and second populations that are equal in number, with these first and second populations containing only particles of a length greater than or equal to, or less than, respectively, the median length.

Figure 5:
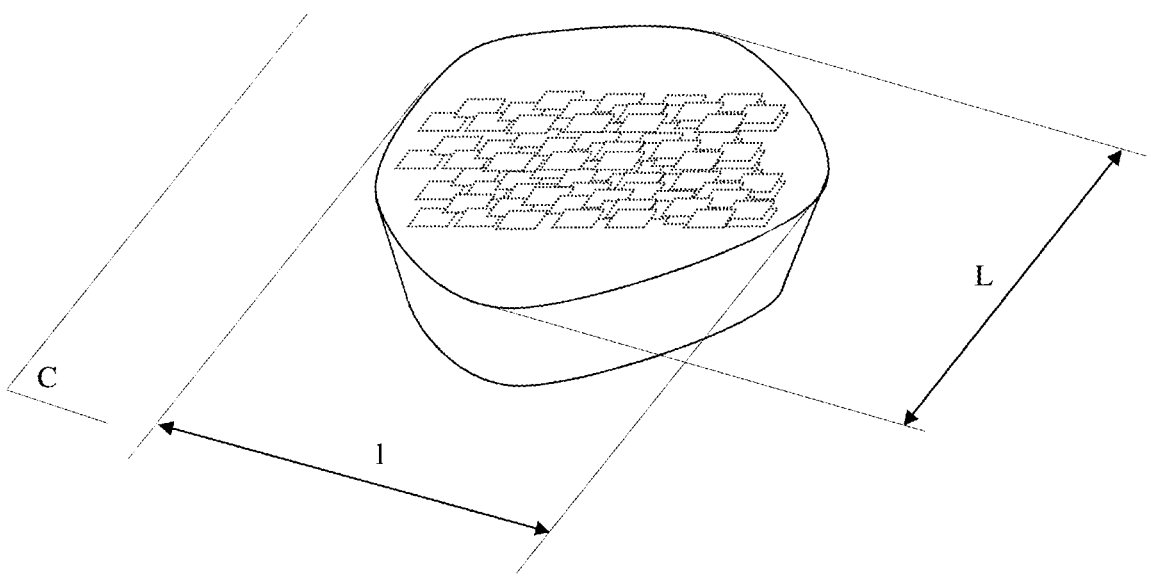
FIG. 5 illustrates yet another sample sintered product.

Length L of a sintered product consistent (FIG. 4) is its largest dimension in a layout C parallel to the general layout of the platelets. If the product is cylindrical, as in FIG. 4, layout C may be any layout parallel to the general layout of the platelets. Otherwise, as in FIG. 5, layout C is chosen from among all the layouts parallel to the general layout of the platelets, as the layout in which the product presents the largest dimension.

Width l of a sintered product is the largest dimension measured in layout C in which the length is measured, following a direction perpendicular to that of the length.

"Stabilized zirconia" refers to a zirconia presenting a quantity of zirconia in a mono-clinical crystallographic shape of less than 5% by mass, the complement consisting of zirconia in a quadratic crystallographic shape, stable and/or metastable and/or cubic.

By definition, a "bimodal" distribution shows two non-contiguous categories with the highest values, referred to as "principal peaks" or "principal modes."

Unless indicated otherwise, an average is an arithmetic average.

Unless indicated otherwise, all percentages corresponding to the composition of a slip are volume percentages compared to the slip volume.

Percentages by volume of a set of particles correspond to percentages taking into consideration the sum of the volumes of each particle in question. The sum of said volumes is typically calculated with respect to the mass of said set of particles divided by the absolute density of the material of said particles. For example, if the second particulate fraction represents less than 20% "of the volume of the set of ceramic particles," or equivalently, "of the volume of the ceramic particles" or "as a volume percentage based on the set of ceramic particles" or "as a volume percentage based on the ceramic particles," the volumes to be compared are the volume of particles of the powder comprising the second particulate fraction and the volume of all the ceramic particles.

The "relative density" of a product is equal to the ratio of the product's apparent density divided by the product's absolute density, expressed as a percentage.

"Apparent density" of a product means, in the sense of embodiments herein, the ratio equal to the product mass divided by the volume that said product occupies. It may be measured by imbibition, according to the principle of buoyancy.

"Absolute density" of a product means, in the sense of embodiments herein, the ratio equal to the mass of said product's dry material after grinding to a thinness such that more or less no closed porosity remains, divided by the volume of said mass of dry material after grinding. It may be measured by helium pycnometry.

A stack of platelets is a structure in which the platelets are laid flat on top of one another, with a possible lateral overlap, as represented, for example, in FIG. 2c.

The various characteristics of a embodiments of a product, as described herein. may be determined by the methods of characterization used for the examples below.

Process for Manufacture

A dense sintered product may be manufactured according to a process containing operations a) to j) above, and as generally shown in FIG. 3.

At operation a) of preparation of the slip, a suspension of ceramic particles is prepared.

The particles in suspension preferably represent more than 1%, preferably more than 2%, preferably more than 5%, preferably more than 8% and less than 45%, preferably less than 40%, preferably less than 35%, preferably less than 30%, preferably less than 25%, and/or preferably less than 20% of the slip volume.

The ceramic particles preferably represent more than 95%, or even more than 99%, or even approximately 100% of the volume of the particles in suspension.

The ceramic particles may be replaced, partially or totally, by the equivalent quantities of precursors, converting themselves to ceramic particles before operation j).

In some embodiments, the first and second particulate fractions together represent more than 85%, preferably more than 90%, preferably more than 95% of all ceramic particles, as a volume percentage. In some embodiments, the first and second particulate fractions together represent more than 98%, preferably more than 99%, and/or preferably approximately 100% of all the ceramic particles, as a volume percentage.

The granulometric distribution of the suspension's ceramic particles is typically bimodal, the two principal modes of which correspond to the first and second particulate fractions, respectively.

First Particulate Fraction

The first particulate fraction, or "platelet fraction," preferably represents more than 85%, preferably more than 88%, preferably more than 90%, preferably more than 92%, and/or preferably more than 94% of all the ceramic particles, as a volume percentage.

In some embodiments, more than 50%, preferably more than 55%, preferably more than 60%, preferably more than 65%, preferably more than 70%, preferably more than 75%, preferably more than 80%, preferably more than 85%, preferably more than 90%, preferably more than 95%, preferably more than 99% by volume of platelets of the first particulate fraction contain more than 50%, preferably more than 60%, preferably more than 70%, preferably more than 80%, preferably more than 90%, preferably more than 95%, preferably more than 97%, preferably more than 98%, and/or preferably more than 99% of alumina by mass.

Preferably, in platelets of the first particulate fraction, the complement to the alumina consists of more than 90% by mass, preferably more than 95%, preferably more than 97%, and/or preferably more than 99% of oxides by mass.

In some embodiments, the first particulate fraction contains, for a total of more than 90%, preferably more than 95%, and/or preferably more than 99%:

more than 60% by volume, based on the volume of the first particulate fraction, of platelets containing more than 50%, preferably more than 60%, preferably more than 70%, preferably more than 80%, preferably more than 90%, preferably more than 95%, preferably more than 97%, preferably more than 98%, and/or preferably more than 99%, by mass of alumina; and less than 40% by volume of platelets containing more than 90%, and/or preferably more than 95%, by mass of boron nitride.

Preferably more than 90%, preferably more than 95%, preferably more than 98%, and/or preferably more than 99%, by volume, of the platelets of the first particulate fraction are of a length less than 70 μm, preferably less than 60 μm, preferably less than 50 μm, preferably less than 40

μm, preferably less than 25 μm, preferably less than 20 μm, or even less than 15 μm and preferably greater than 2 μm, preferably greater than 4 μm, and/or preferably greater than 5 μm.

Preferably more than 90%, preferably more than 95%, preferably more than 98%, and/or preferably more than 99%, by volume, of platelets of the first particulate fraction are of a width less than or equal to 20 μm, preferably less than 15 μm, and/or preferably less than 10 μm, and preferably greater than 2 μm, preferably greater than 3 μm, and/or preferably greater than 4 μm.

Preferably more than 90%, preferably more than 95%, preferably more than 98%, and/or preferably more than 99%, by volume, of platelets of the first particulate fraction are of a thickness less than or equal to 3 μm, preferably less than or equal to 2.5 μm, preferably less than or equal to 2 μm, preferably less than or equal to 1.5 μm, or even less than or equal to 1 μm.

Second Particulate Fraction

Remarkably, the presence of thin particles of the second particulate fraction considerably improves the density of the sintered product.

The second particulate fraction preferably represents more than 2%, preferably more than 3%, preferably more than 4% and less than 10%, preferably less than 9%, preferably less than 8%, preferably less than 7%, and/or preferably less than 6% of the ceramic particles, as a volume percentage based on all the ceramic particles.

In some embodiments, more than 90%, preferably more than 95%, preferably more than 98%, by number of particles of the second particulate fraction, are a length of at least 15 times, preferably at least 20 times, preferably at least 25 times, and/or preferably at least 30 times less than $L1_{50}$.

Preferably, the particles of the second particulate fraction comprise more than 93%, preferably more than 95%, preferably more than 97%, preferably more than 98%, preferably more than 99%, preferably more than 99.5%, and/or preferably more than 99.9% of oxides.

In some embodiments, the second particulate fraction comprises more than 80%, preferably more than 90%, preferably approximately 100% by volume, of ceramic particles that are not glass particles, preferably alumina particles and/or zirconia particles and/or stabilized zirconia particles and/or alumina-zirconia particles, preferably alumina particles. In some embodiments, the second particulate fraction does not include glass and/or vitroceramic particles.

A stabilized zirconia is preferably a zirconia stabilized by yttrium oxide, cerium oxide, calcium oxide, magnesium oxide, scandium oxide and their mixtures.

In some embodiments, the second particulate fraction includes glass and/or vitroceramic particles, preferably glass particles, preferably in a mixture with ceramic particles that are not glass particles, preferably alumina particles and/or zirconia particles and/or stabilized zirconia particles and/or alumina-zirconia particles, preferably alumina particles.

Glass and/or vitroceramic particles may be partially or totally replaced by the equivalent quantities of particles of glass precursors and/or vitroceramic particles, respectively. This substitution is also applicable for all optional characteristics relating to the glass and vitroceramic particles described below.

In many embodiments, all glass and/or vitroceramic particles present a median length $D_{50v}$ at least 50 times less than $L1_{50}$, preferably at least 100 times less than $L1_{50}$, preferably at least 150 times less than $L1_{50}$, preferably at least 200 times less than $L1_{50}$, preferably at least 300 times less than $L1_{50}$.

In some embodiments, the quantity of glass and/or vitroceramic particles is greater than 0.5%, and/or preferably greater than 1% as a volume percentage based on all the ceramic particles. In certain embodiments, the quantity of glass and/or vitroceramic particles is less than 18%, or even less than 10%, or even less than 5%, as a volume percentage based on all the ceramic particles in suspension.

Generally, the ratio of the volume quantity of particles that are neither glass particles nor vitroceramic particles over the total volume quantity of glass particles and vitroceramic particles is greater than 0.5, preferably greater than 1 and/or less than 4, preferably less than 3, and/or preferably less than 2.5.

Also generally, the median length $D_{50c}$ of particles that are neither glass particles nor vitroceramic particles is greater than 0.5 times, preferably greater than 0.7 times, and/or preferably greater than 0.8 times the product
  of the volume percentage of the second particulate fraction based on all the ceramic particles of the slip and
  of the average thickness of the particles of the first particulate fraction W1*, and, preferably, less than 1.5 times, preferably 1.3, or even 1.2 times said product.

In some embodiments, the median length of the glass and/or vitroceramic particles of the second particulate fraction $D_{50v}$ is at least 2 times, preferably at least 4 times, and/or preferably at least 5 times less than the median length of particles that are not glass particles of the second particulate fraction.

In some embodiments, the temperature of the vitreous transition of the glass of said glass particles is between the temperature at the start of densification and the temperature at the end of densification, the start and end densification temperatures being measured on a product obtained by the same process and based on the same slip, but containing no glass particle. The temperatures at the start and end of densification are measured on a dilatometer and correspond to the temperature at which removal begins and the temperature when removal ends, respectively.

In some embodiments, the glass particles are chosen in the group consisting of glass containing silica, glass containing boron oxide, and their mixtures.

Glass Containing Silica

Generally, the glass particles are chosen from the group of glasses preferably comprising more than 90%, preferably more than 95% by mass of $SiO_2$ on the one hand, and CaO and/or MgO and/or $Na_2O$ and/or $TiO_2$ and/or $K_2O$ and/or $Al_2O_3$ on the other hand, preferably $SiO_2$, and CaO and/or MgO and/or $Al_2O_3$, and/or preferably $SiO_2$, and CaO and/or MgO.

In some embodiments, the second particulate fraction comprises more than 80%, preferably more than 90%, and/or preferably approximately 100% by volume, of alumina particles, and/or zirconia particles, and/or stabilized zirconia particles, and/or alumina-zirconia particles, and/or glass particles comprising more than 90%, preferably more than 95% by mass of $SiO_2$ on the one hand, and CaO and/or MgO and/or $Na_2O$ and/or $TiO_2$ and/or $K_2O$ and/or $Al_2O_3$ on the other hand, preferably $SiO_2$, and CaO and/or MgO and/or $Al_2O_3$, preferably $SiO_2$, and CaO and/or MgO.

Typically the silica content of said glass particles containing silica is greater than 10%, greater than 20%, greater than 30%, greater than 40%, greater than 50%, greater than 60%, greater than 70%, and/or greater than 80% by mass. Preferably, the glass contains $SiO_2$ on the one hand, and CaO and/or $Al_2O_3$ on the other hand. Preferably, the glass contains $SiO_2$ and CaO and $Al_2O_3$. In some embodiments, the $SiO_2$/CaO molar ratio falls between 2 and 4, preferably between 2.5 and 3.5, or even approximately equal to 3.

Glass Containing Boron Oxide

Glasses containing boron oxide may be glasses containing $B_2O_3$ on the one hand, and CaO and/or $Na_2O$ and/or $TiO_2$ and/or $K_2O$ and/or $Al_2O_3$, on the other hand. Preferably the $B_2O_3$ content of said glasses based on boron oxide is greater than 10%, greater than 20%, greater than 30%, greater than 40%, greater than 50%, greater than 60%, greater than 70%, and/or greater than 80% by mass.

Liquid Phase

The liquid phase preferably contains more than 50%, preferably more than 60%, preferably more than 70%, preferably more than 80%, preferably more than 90% water, and/or preferably more than 95% water, as a volume percentage based on the liquid phase. The liquid phase may consist of water.

The quantity of liquid phase is preferably greater than 50%, preferably greater than 60%, preferably greater than 70%, preferably greater than 80%, or even greater than 90%, as a percentage by volume of slip.

The slip preferably contains a dispersant facilitating the acquisition of a consistent suspension. Preferably, the dispersant content is between 0.1% and 3%, preferably between 0.2% and 2%, preferably between 0.5% and 1.5%, by mass, based on the mass of the ceramic particles of the slip. Dispersants typically used in the manufacture of products sintered by casting in slip may be applied, for example ammonium polymethacrylates such as Darvan 7-NS, manufactured by Vanderbilt.

The slip may contain a thickening agent. In some embodiments the thickening agent content is between 0.1% and 3%, and may be between 0.1% and 1%, by mass, based on the mass of the ceramic particles of the slip. For example, Carbopol EDT 2691, sold by Lubrizol, may be used as a thickening agent.

The slip may contain a binding agent, which may be temporary. Generally the binding agent content is between 0.5% and 5% by mass based on the mass of the ceramic particles of the slip. Temporary binders typically used in the manufacture of sintered products may be applied, for example polyvinyl alcohol (PVA) and polyethylene glycols (PEG).

The slip may also contain an anti-foaming agent. In some embodiments the anti-foaming agent content is between 0.1 and 3%, and/or between 0.1% and 1% by mass based on the mass of the ceramic particles of the slip. Antifoaming agents typically used in the manufacture of products sintered by casting in slip may be applied, for example CONTRASPUM CONC sold by the company Zschimmer and Schwarz.

In some embodiments, the ceramic particles, water, any dispersant, any thickening agent, any binding agent, and any anti-foaming agent together represent more than 80%, more than 90%, more than 95%, more than 99%, or even approximately 100% of the slip volume.

Typically the various components of the slip are added while agitating.

The various components of the slip may be mixed using any technique known by industry experts, for example, in a mixer, a turbulator, a pellet-jar grinder, and often of the same kind as for the ceramic powder in suspension. The mixture intensity and/or mixing time may be adjusted in such a way as to not break the platelets. To that end, the platelets typically are to be introduced last, in a pre-mixture containing the other components.

If a jar grinder is used, mixing time may be greater than 0.5 hours and less than 20 hours. In certain embodiments, a jar grinder is used, with the platelets introduced in a pre-mixture mixed in advance for 12 hours, with mixing time based on the introduction of the platelets into the slip more than 30 minutes and generally less than 4 hours in advance.

The mixture may be facilitated using an ultrasound transfer to the slip.

At operation b), air bubbles are removed, typically using a vacuum degasifier or ultrasound.

At operation c), the slip is cooled in such a way as to solidify the water and form ice crystals.

Any technique known by industry experts that allows for freezing of a slip may be used, for example ice templating or freeze granulation, or techniques consisting of immersing a quantity of slip into a coolant bath, such as liquid nitrogen.

Particularly when the slip is immersed in a coolant bath or in the case of guided freezing, the rate of freezing may be greater than 1 µm/s, greater than 5 µm/s, preferably than 10 µm/s, greater than 12 µm/s, or even greater than 15 µm/s, or even greater than 20 µm/s, or even greater than 40 µm/s and less than 400 µm/s, less than 300 µm/s, less than 200 µm/s, or even less than 100 µm/s.

In some embodiments, the freezing operation is guided in accordance with a privileged direction comprising a solidification front. In this method, generally the thermal gradient is greater than 10° C./cm, or even 20 greater than 20° C./cm and less than 200° C./cm, or even less than 150° C./cm, or even less than 100° C./cm.

The size of the ice crystals depends largely on the speed of movement of the solidification front and the thermal gradient associated with this solidification front. The faster the solidification front, the smaller the size of the ice crystals.

In some embodiments, however, the slip is frozen without favoring a direction of freezing. The process for it is considerably simplified.

Generally, the slip is immersed in a coolant bath, for example of liquid nitrogen, and the slip is removed from it when more or less entirely frozen.

Typically, the entire slip is solidified during operation c).

At operation d), the solidified slip is placed under pressure and temperature conditions that result in removal of the ice crystals, for example by sublimation. Effectively, sublimation is carried out more or less without moving the particles placed between the crystals. For example, the ice crystals can be sublimated by heating them at very low pressure, typically at a pressure below 0.5 mbar, preferably below 0.3 mbar.

The ice crystals can also be made to melt, and let the liquid water that is obtained run off.

Operation d) may be continued until all ice crystals are removed.

an intermediary product, in the form of a block or agglomerates, may thus be formed or otherwise obtained.

The intermediary product may be dried if moist, with drying preferably being carried out at a temperature of between 50° C. and 110° C., for a duration preferably greater than 2 hours, and/or preferably greater than 10 hours.

In some embodiments, operation d) is an operation for eliminating ice crystals by sublimating them; methods described herein generally do not then require said drying.

At operation e), if the intermediary product is not in powder form, it is ground and/or sieved to convert it to a powder.

The product may be considered as not being in powder form if it cannot pass through a sieve of square grids 25 mm on a side, preferably 15 mm, preferably 10 mm, preferably 5 mm, preferably 4 mm, preferably 3 mm, and/or preferably 2 mm per side.

Grinding may be carried out dry by any technique known to industry experts, preferably using a bowl containing moving objects (rings, disks or pellets), a manual press or a pestle.

Sieving may be carried out using a sieve with openings smaller than 1 mm, or even less than 500 µm, or even less than 400 µm. Effectively, this operation allows for removal of the largest agglomerates.

At operation f), optional, debinding allows for the elimination of organic materials. It is preferably carried out using thermal treatment, preferably at a temperature of between 300° C. and 500° C., typically under air. The time for maintaining the maximum temperature is generally less than or equal to 2 hours.

Operation g) for chemical pre-treatment, optional, promotes attachment of the particles of the second particulate fraction to the platelets of the first particulate fraction.

The maximum temperature attained at operation g) may be greater than 600° C., greater than 700° C., greater than 800° C. and/or less than 1200° C.

The time for maintaining maximum temperature is preferably less than 5 hours, and/or preferably less than 2 hours. In some embodiments, the time for maintaining maximum temperature is approximately zero.

If the first particulate fraction contains platelets of boron nitride, this operation is preferably executed in a nitrogen atmosphere.

At operation h), the intermediary product in the form of powder is shaped by pressing, injection molding or extrusion to obtain a pre-form.

All injection molding techniques are possible. In the case of shaping by injection molding, the intermediary product in powder form is typically mixed with a wax or polymer to obtain a compound with a rheology appropriate for injection molding.

All extrusion techniques are possible. In the case of shaping by extrusion, the intermediary product in powder form is typically mixed with water and products, which may be organic, that facilitate extrusion, specifically plastics and lubricants. The quantity of plastics and lubricants may be between 1% and 5%, and/or between 1.5% and 3% by mass, based on the total mass of the powder of the intermediary product, the water and said plastics and lubricants.

The quantity of water may be between 10% and 25%, such as between 15% and 20% by mass, based on the total mass of the powder of the intermediary product, the water and said plastics and lubricants.

Extrusion may be carried out at atmospheric pressure or in a vacuum.

In the case of shaping by injection molding or extrusion, drying and/or debinding may be carried out after shaping, for example by thermal treatment, in which the temperature is a function of the plastics, lubricants, polymers and waxes used in the shaping.

Generally, the powder is shaped by pressing. The process is effectively simplified.

In some embodiments, pressing is configured so that sintering of the pre-form at operation i) yields a sintered product with a relative density greater than 90%, or even greater than 95%.

All pressing techniques are possible. Pressing techniques include uni-axial pressing and cold iso-static pressing.

In the case of shaping by pressing, the intermediary product in powder form is poured into a mold, then subjected to pressure preferably greater than 3 MPa, preferably greater than 5 MPa, or even greater than 10 MPa, or even greater than 50 MPa and preferably less than 200 MPa, or even less than 150 MPa, to constitute a raw piece, or "pre-form." The powder agglomerates are effectively deformed under the effect of this pressure.

At operation i), the pre-form is sintered in an oxidizing, neutral or reductive atmosphere.

Generally, if the product contains boron nitride, the atmosphere during sintering is neutral, and may occur in a vacuum.

Typically, sintering is carried out in a vacuum, preferably in a vacuum with a value less than 10 mbar, and/or preferably less than 5 mbar.

The pressure applied in operation i) is greater than 1 MPa, preferably greater than 2 MPa, preferably greater than 3 MPa, preferably greater than 4 MPa, preferably greater than 5 MPa, preferably greater than 6 MPa, preferably greater than 7 MPa, preferably greater than 8 MPa, preferably greater than 9 MPa, preferably greater than 10 MPa, preferably greater than 11 MPa, preferably greater than 12 MPa, preferably greater than 13 MPa, preferably greater than 14 MPa, preferably greater than 15 MPa, preferably greater than 16 MPa, preferably greater than 17 MPa, preferably greater than 20 MPa, preferably greater than 25 MPa, preferably greater than 30 MPa, preferably greater than 35 MPa, preferably greater than 40 MPa, and/or preferably greater than 45 MPa, and preferably less than 150 MPa and/or, preferably less than 100 MPa.

Preferably, more than 20%, and/or preferably more than 50% of the pressure is applied over more than 50%, preferably over more than 70%, and/or preferably over more than 90% of the cycle while only tracking the rise in temperature and the potential leveling at maximum temperature.

The leveling time, temperature and sintering atmosphere are determined as a function of the nature and characteristics of the product to be manufactured. These parameters are well known to industry experts.

The maximum temperature achieved during sintering is generally between 1300° C. and 1700° C., and typically between 1450° C. and 1550° C.

Following operation i), a sintered product may be obtained.

Operations h) and i) may be carried out in one single operation, for example, by using a spark plasma sintering (SPS) process.

In some embodiments, operations h) and i) are carried out in a single operation by using an SPS process.

SPS may be carried out in a vacuum, and/or at a maximum temperature of between 1300° C. and 1700° C., generally between 1450° C. and 1550° C., and/or at a pressure greater than 30 MPa, or even greater than 40 MPa.

At operation j), the sintered product may be machined by any suitable technique, including milling, planing, CNC cutting, laser cutting, grinding, and so on.

Embodiments in the form of a product may include the following characteristics at various operations of the described method. At operation a): the particles in suspension represent more than 8% and less than 20% of the slip volume; and the ceramic particles represent more than 95% of the volume of the particles in suspension; and the first and second particulate fractions together represent more than 99% of all ceramic particles, as a volume percentage; and the granulometric distribution of the ceramic particles of the slip is bimodal, the two principal modes corresponding to the first and second particulate fractions, respectively; and the first particulate fraction, or "platelet fraction," represents more than 94% of all ceramic particles, as a volume percentage; and more than 99% by volume of the platelets of the first particulate fraction contain more than 99%, by mass of alumina; and more than 95% by volume of the platelets of the first particulate fraction are of a length less than 20 µm and greater than 4 µm, a width less than 10 µm and greater than 3 µm, and a thickness less than or equal to 1.5 µm; and the second particulate fraction represents more than 3% and less than 6% of the ceramic particles, as a volume percentage based on all the ceramic particles; and more than 95%, by number, of the particles of the second particulate fraction are of a length at least 25 times less than $L1_{50}$; and the second particulate fraction includes glass particles in a mixture with alumina particles, the ratio of the volume quantity of particles that are neither glass particles nor vitroceramic particles over the total volume quantity of glass particles and vitroceramic particles is greater than 0.5 and less than 2.5; and the glass particles are chosen from the group of glasses comprising more than 90% of $SiO_2$ by mass, on the one hand, and of CaO and/or MgO on the other hand, and at operation c), the rate of freezing is greater than 10 µm/s and less than 100 µm/s; and operation d) is an operation of removal of the ice crystals by sublimation; and operations h) and i) are carried out in a single operation using an SPS process, under vacuum, at a maximum temperature of between 1300° C. and 1700° C., and at a pressure greater than 30 MPa.

Embodiments in the form of a method or process allow for the manufacture of a product having remarkable mechanical properties, and specifically tenacities.

Example Product

A sintered product consistent may be obtained or be likely to have been obtained by methods or processes described herein.

In some embodiments, more than 50%, preferably more than 60%, preferably more than 70%, preferably more than 80%, preferably more than 90%, preferably more than 95%, preferably more than 98%, preferably more than 99%, and/or preferably approximately 100% by number of platelets of the sintered product contain more than 50%, preferably 60%, preferably 70%, preferably 80%, preferably more than 85%, preferably more than 90%, preferably more than 95%, preferably more than 98%, and/or preferably more than 99% of alumina by mass.

In some embodiments, the sintered product contains more than 1%, or even more than 5%, or even more than 10%, or even more than 15% and less than 20% de boron nitride, by mass based on the product's mass, boron nitride being present in the form of platelets. Preferably, the other platelets present are platelets containing more than 50%, preferably 60%, preferably 70%, preferably 80%, preferably more than 85%, preferably more than 90%, preferably more than 95%, preferably more than 98%, and/or preferably more than 99% alumina by mass. Surprisingly, the addition of boron nitride in the form of platelets modifies little or none of the relative density of the sintered product after sintering, and the non-fragile behavior in the SENB method.

Also, more than 90%, preferably more than 95%, and/or preferably more than 98%, by number of platelets are of a length less than 70 µm, preferably less than 60 µm, preferably less than 50 µm, preferably less than 40 µm, preferably less than 25 µm and preferably greater than 2 µm, and/or preferably greater than 4 µm.

Ceramic particles other than platelets may at least be partially invisible after operation i) of sintering, making them difficult to quantify. However, they contribute to obtaining a sintered product with a relatively high density.

The relative density corresponding to an example sintered product is preferably greater than 92%, preferably greater than 94%, preferably greater than 95%, preferably greater than 96%, preferably greater than 97%, preferably greater than 97.5%, preferably greater than 98%, and/or preferably greater than 98.5%.

Figure 6:
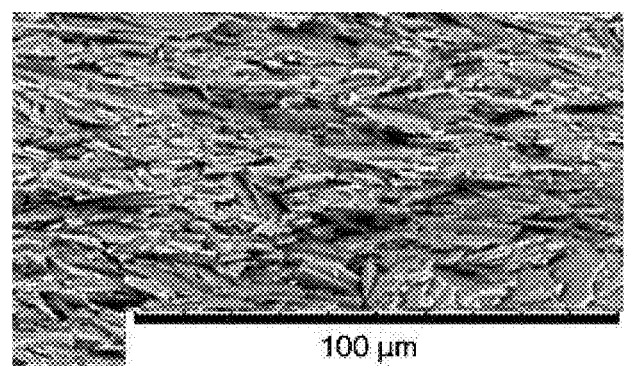
FIG. 6 illustrates the microstructure of a sample sintered product.

The platelets are stacked on top of one another. They are then laid out in roughly parallel lines, as may be seen in FIG. 6 showing a picture of the microstructure of the product in example 2. More precisely, the typical average variance around the average principal orientation is less than 20°, and even less than 16°, the average principal orientation and the average typical variance around the average principal orientation being determined by the method described in the examples. A reduction in the average typical variance around the average principal orientation considerably improves tenacities K1c and Kjc of the sintered product.

The average thickness of the platelets of the sintered product is preferably less than 2.5 µm, preferably less than 2.0 µm, preferably less than 1.5 µm, preferably less than 1.0 µm. Effectively, the mechanical properties, specifically the rupture module, are improved by it.

In some embodiments, the width l of the sintered product is greater than 60 mm and less than or equal to 80 mm. In other embodiments, the width of the sintered product is greater than 80 mm, greater than 81 mm, greater than 85 mm, or even greater than 90 mm, or even greater than 100 mm, or even greater than 150 mm.

An embodiment in the form of a sintered product generally shows remarkable toughness. Preferably, crack initiation toughness K1c is greater than 4 MPa·m$^{1/2}$, preferably greater than 4.5 MPa·m$^{1/2}$, preferably greater than 5 MPa·m$^{1/2}$, preferably greater than 5.5 MPa·m$^{1/2}$, and/or preferably greater than 6 MPa·m$^{1/2}$.

Also preferably, toughness Kjc is greater than 7 MPa·m$^{1/2}$, preferably greater than 8 MPa·m$^{1/2}$, and/or preferably greater than 9 MPa·m$^{1/2}$.

Tenacities K1c and Kjc may be determined by following the methods described in the examples, or through any other suitable measurement or determination technique.

In some embodiments, the sintered product contains more than 80% by mass, preferably more than 95%, preferably more than 97%, and/or preferably more than 99% by mass of oxides.

In some embodiments, more than 50%, preferably more than 60%, preferably more than 70%, preferably more than 80%, preferably more than 90%, preferably more than 95%, preferably more than 98%, preferably more than 99%, and/or preferably approximately 100% by number of platelets contain more than 50%, preferably 60%, preferably 70%, preferably 80%, preferably more than 85%, preferably more than 90%, preferably more than 95%, preferably more than 98%, and/or preferably more than 99% of alumina by mass.

In some embodiments, the chemical analysis of the sintered product is the following, by percentage of mass: the $SiO_2$ content is greater than 0.2%, preferably greater than 0.3%, preferably greater than 0.5%, and preferably less than 13.5%, preferably less than 10%, preferably less than 8%, preferably less than 6%, preferably less than 5%, preferably less than 4%, preferably less than 3%, preferably less than 2%, preferably less than 1.5%, and the CaO+MgO content is greater than 0.1%, preferably greater than 0.15%, or even greater than 0.2%, and/or preferably less than 4.5%, preferably less than 3%, preferably less than 2%, preferably less than 1.5%, preferably less than 1%, preferably less than 0.8%, and/or preferably less than 0.5%, and the alumina and other elements being the complement at 100%, the content of other elements being less than 2%, is preferably less than 1.5%, preferably less than 1%, preferably less than 0.8%, and/or preferably less than 0.5%.

According to some embodiments, the $Al_2O_3$ content is greater than 81%, preferably greater than 85%, preferably greater than 89%, preferably greater than 90%, preferably greater than 92%, preferably greater than 94%, preferably greater than 95%, preferably greater than 96.9%, and preferably less than 99.7%, and/or preferably less than 99.5%.

According to other embodiments, the chemical analysis of the product is the following, as percentages of mass: the $SiO_2$ content is greater than 0.2%, preferably greater than 0.3%, preferably greater than 0.5%, and preferably less than 13.5%, preferably less than 10%, preferably less than 8%, preferably less than 6%, preferably less than 5%, preferably less than 4%, preferably less than 3%, preferably less than 2%, preferably less than 1.5%, and the CaO content is greater than 0.1%, preferably greater than 0.15%, or even greater than 0.2%, and preferably less than 4.5%, preferably less than 3%, preferably less than 2%, preferably less than 1.5%, preferably less than 1%, preferably less than 0.8%, preferably less than 0.5%, and the MgO content is less than 0.3%, preferably less than 0.25%, preferably less than 0.2%, preferably less than 0.15%, preferably less than 0.1%, or even less than 0.05%, and the alumina and other elements being the complement at 100%, the content of other elements being less than 2%, is preferably less than 1.5%, preferably less than 1%, preferably less than 0.8%, and/or preferably less than 0.5%.

Typically in this second embodiment, the $Al_2O_3$ content is greater than 81%, preferably greater than 85%, preferably greater than 89%, preferably greater than 90%, preferably greater than 92%, preferably greater than 94%, preferably greater than 95%, preferably greater than 96.8%, and preferably less than 99.7%, preferably less than 99.5%

In a third embodiment, the chemical analysis of the product is the following, as percentages of mass: the $SiO_2$ content is greater than 0.2%, preferably greater than 0.3%, preferably greater than 0.5%, and preferably less than 13.5%, preferably less than 10%, preferably less than 8%, preferably less than 6%, preferably less than 5%, preferably less than 4%, preferably less than 3%, preferably less than 2%, preferably less than 1.5%, and the MgO content is greater than 0.1%, preferably greater than 0.15%, or even greater than 0.2%, and preferably less than 4.5%, preferably less than 3%, preferably less than 2%, preferably less than 1.5%, preferably less than 1%, preferably less than 0.8%, preferably less than 0.5%, and the CaO content is less than 0.3%, preferably less than 0.25%, preferably less than 0.2%, preferably less than 0.15%, preferably less than 0.1%, or even less than 0.05%, and the alumina and other elements being the complement at 100%, the content of other elements being less than 2%, is preferably less than 1.5%, preferably less than 1%, preferably less than 0.8%, preferably less than 0.5%.

In this third embodiment, the $Al_2O_3$ content is greater than 81%, preferably greater than 85%, preferably greater than 89%, preferably greater than 90%, preferably greater than 92%, preferably greater than 94%, preferably greater than 95%, preferably greater than 96.8%, and preferably less than 99.7%, and/or preferably less than 99.5%.

In a fourth embodiment, the chemical analysis of the product is the following, as percentages of mass: the content of $ZrO_2$, potentially stabilized, is greater than 1% and less than 15%, and the $SiO_2$ content is greater than 0.2%, preferably greater than 0.3%, preferably greater than 0.5%, and preferably less than 13.5%, preferably less than 10%, preferably less than 8%, preferably less than 6%, preferably less than 5%, preferably less than 4%, preferably less than 3%, preferably less than 2%, preferably less than 1.5%, and the CaO+MgO content is greater than 0.1%, preferably greater than 0.15%, or even greater than 0.2%, and preferably less than 4.5%, preferably less than 3%, preferably less than 2%, preferably less than 1.5%, preferably less than 1%, preferably less than 0.8%, preferably less than 0.5%, and the content of alumina and other elements being the complement at 100%, the content of other elements being less than 10%, is preferably less than 8%, preferably less than 5%, preferably less than 4%, preferably less than 2%, preferably less than 1.5%, preferably less than 1%, preferably less than 0.8%, and/or preferably less than 0.5%.

In the fourth embodiment, the zirconia $ZrO_2$, potentially stabilized, derives exclusively from the second particulate fraction.

In a fifth embodiment, the chemical analysis of the product is the following, as percentages of mass: the $SiO_2$ content is greater than 0.2%, preferably greater than 0.3%, preferably greater than 0.5%, and preferably less than 13.5%, preferably less than 10%, preferably less than 8%, preferably less than 6%, preferably less than 5%, preferably less than 4%, preferably less than 3%, preferably less than 2%, preferably less than 1.5%, and the CaO+MgO content is greater than 0.1%, preferably greater than 0.15%, or even greater than 0.2%, and preferably less than 4.5%, preferably less than 3%, preferably less than 2%, preferably less than 1.5%, preferably less than 1%, preferably less than 0.8%, preferably less than 0.5%, and the boron nitride content is greater than 1% and less than 20%, and the content of alumina and other elements being the complement at 100%, the content of other elements being less than 10%, is preferably less than 8%, preferably less than 5%, preferably less than 4%, preferably less than 2%, preferably less than 1.5%, preferably less than 1%, and/or preferably less than 0.8%, preferably less than 0.5%.

In a sixth embodiment, the chemical analysis of the product is the following, as percentages of mass: the content of $ZrO_2$, potentially stabilized, is greater than 1% and less than 15%, and the $SiO_2$ content is greater than 0.2%, preferably greater than 0.3%, preferably greater than 0.5%, and preferably less than 13.5%, preferably less than 10%, preferably less than 8%, preferably less than 6%, preferably less than 5%, preferably less than 4%, preferably less than 3%, preferably less than 2%, preferably less than 1.5%, and the CaO+MgO content is greater than 0.1%, preferably greater than 0.15%, or even greater than 0.2%, and preferably less than 4.5%, preferably less than 3%, preferably less than 2%, preferably less than 1.5%, preferably less than 1%, preferably less than 0.8%, preferably less than 0.5%, and the boron nitride content is greater than 1% and less than 20%, and the content of alumina and other elements being the complement at 100%, the content of other elements being less than 10%, is preferably less than 8%, preferably less than 5%, preferably less than 4%, preferably less than 2%, preferably less than 1.5%, preferably less than 1%, preferably less than 0.8%, and/or preferably less than 0.5%.

Typically in this sixth embodiment, the zirconia $ZrO_2$, potentially stabilized, derives exclusively from the second particulate fraction.

Regardless of the particular embodiment, the "other elements" refer to the components other than those cited elsewhere, with potential zirconia stabilizers not included in the "other elements" if the zirconia is stabilized.

Generally, in the sintered product more than 85% of its volume, preferably more than 90% of its volume, and/or preferably more than 95% of its volume consists of a stack of ceramic platelets.

The volume of platelets of the sintered product may be estimated suing surface pictures from the fracture carried out using a Scanning Electron Microscope (SEM), as described in the examples portion of the description.

Example Electronic Device

Electronic devices may have, incorporate, or otherwise include a housing, structure, internal support, input surface, or other element that is a dense sintered product in accordance with embodiments described herein. Sample electronic devices include, but are not limited to, a mobile telephone, computer keyboard, computer mouse, computer tablet, portable electronic device, specifically a portable computer, a wearable device, specifically a watch, jewelry or glasses, a multimedia reader, a touch-sensitive device and a virtual reality device.

The sintered product (e.g., housing) may define an internal cavity in which one or more electronic components are placed and/or secured to provide the functionality of the electronic device. One or more openings may be defined in the sintered product/housing through which a switch, button, cover glass, camera, or other element may protrude, or in which any such electronic element may be placed. Further, the housing may be formed from multiple sintered pieces that are attached to one another. As yet another example, one or more splits may be formed from sintered material as defined herein, or splits may be used to join multiple housing pieces together, where one or more housing pieces are formed from the sintered material.

Use of a sintered product as a housing (or portion of a housing, such as a corner, edge or the like) improves the device's shock resistance compared to electronic devices manufactured using traditional materials. Given the toughness properties of the sintered products described as embodiments herein, an electronic device housing formed from such sintered material be thinner than a traditional case, while conferring good resistance against ordinary shocks and accidents that occur during use.

The methods described herein should not be interpreted as restricting the scope of the description, including the claims, or as excluding other electronic devices or housings thereof, and are intended as examples only.

Moreover, an expert in the field will understand that the various methods of use and/or manufacture described are given only as an example and are not intended to suggest that the scope of the description, including the claims, is limited to said methods.

EXAMPLES

The following non-restrictive examples are given for purposes of illustrating various embodiments.

The following raw materials have been used:

TM-DAR Taimicron alumina powder sold by Krahn Chemie GmbH,

RonaFlair White Sapphire alumina platelet powder sold by Merck,

Nexsil 20K colloidal silica solution sold by NYACOL, $CaCO_3$ calcium carbonate powder of purity greater than or equal to 99%, sold by Sigma-Aldrich, Darvan 7NS powder sold by VanderBilt, Carbopol EDT 2691 powder sold by Lubrizol, Tergitol NP-9 sold by Sigma-Aldrich, Très BN PUHP 3016 hexagonal boron nitride platelet powder sold by Saint-Gobain.

The products in the examples have been manufactured following a process consistent with embodiments described herein.

Example 1

The product of example 1, which is not to be considered an embodiment, is the product of example 11 of WO2015189659.

Example 2

The product of example 2 is manufactured according to the following process:

At operation a), the components shown in Table 1a below have been mixed to form a slip, according to the following process. The Darvan 7NS is dispersed in the water; the second particulate fraction is then added, and all of it is then mixed for 12 hours in the rotating jar, with alumina pellets, to ensure proper deagglomeration; the Carbopol EDT 2691 and the first particulate fraction are then added, and the suspension is then mixed for 3 hours in a rotating jar with alumina pellets to obtain the slip.

In Tables 1a and 2a, % V designates a volume percentage based on the slip volume.

TABLE 1a

| Components of example 2 | % V |
|---|---|
| First particulate fraction: RonalFlair White Sapphire powder | 13.27 |
| Second particulate fraction: TM-DAR Taimicron alumina powder | 0.41 |
| Second particulate fraction: Nexsil 20K colloidal silica solution | 0.95 |
| Second particulate fraction: $CaCO_3$ calcium carbonate | 0.14 |
| Carbopol EDT 2691 | 0.25 |
| Darvan 7NS | 0.55 |
| De-ionized water | 84.43 |

Characteristics of Example 2

TABLE 1b

| | |
|---|---|
| % volume of all ceramic particles based on slip volume | 13.97 |
| % volume of the first particulate fraction, based on the volume of all the ceramic | 95 |

TABLE 1b-continued

| particles | |
|---|---|
| Median length $L1_{50}$ of the first particulate fraction (μm) | 9 |
| Average thickness $W1_{50}$ of the first particulate fraction (μm) | 0.5 |
| % volume of the second particulate fraction, based on all ceramic particles | 5 |
| % volume of glass particles of the second particulate fraction, based on the volume of all ceramic particles | 2.1 |
| % volume of ceramic particles of the second particulate fraction other than the glass particles, based on the volume of all ceramic particles | 2.9 |
| Median length $D_{50}$ of the glass particles of the second particulate fraction (μm) | 0.02 |
| Median length $D_{50}$ of ceramic particles that are not glass particles or glass precursors of the second particulate fraction (μm) | 0.1 |

No operation b) degasification was carried out.

At operation c), the slip is poured into a large stainless steel container, the slip height in the container being equal to approximately 15 mm. The container is then quickly immersed in a liquid nitrogen bath. Complete freezing of the slip is effected in approximately 20 minutes. The frozen slip is then drawn off.

At operation d), the frozen slip is placed into a lyophilisator. A temperature sensor placed under the block of frozen slip allows for monitoring the progress of the lyophilization. The pressure indicator inside the lyophilisator is set at 0.2 absolute mbar. The duration of lyophilization is approximately 5 days. At the end of operation d) an intermediary product is obtained in the form of a dry block, having a low mechanical content.

At operation e), the block is ground using a hand press and the powder obtained is sifted at 1 mm.

In operations f) and g) (which may be consolidated into a single operation), the powder is placed into an oven to undergo thermal treatment consisting of a rise in temperature of 50° C./h, leveling out for one hour at 400° C., an increase at 100° C./h up to 900° C., and a drop at 300° C./h. This thermal treatment allows for, on the one hand, removal of the organic elements from the powder, and on the other hand, strengthening of the adherence of the ceramic particles of the second particulate fraction on the platelets.

At operation h), a graphite matrix, 80 mm in diameter, is filled with powder. The powder is then pressed at ambient temperature at a pressure of 5 MPa to create a pre-form.

At operation i), the matrix is placed in a SPS H-HP D 320 oven produced by FCT Systeme GmbH. The pre-form then undergoes sintering under load, at 1,500° C. for 15 minutes at a pressure equal to 50 MPa. The speed of increase up to the leveling temperature is equal to 100° C./min.

Operation i) yields a sintered product of a diameter equal to 80 mm.

Example 3

In example 3, operations a), c), d), e), f) and g) identical to those of example 2 have been executed.

At operation h), the powder is shaped by pressing, at a pressure of 200 MPa, to obtain a pre-form.

At operation i), the pre-form is sintered without applying pressure during sintering, according to the following cycle: the temperature is increased at a rate of 5° C./min up to 1500° C., the temperature is then maintained for 2 hours at 1500° C., the temperature is reduced at a rate of 5° C./min.

At the end of operation i), a sintered product of a diameter equal to 80 mm is obtained.

Example 3, comparative, is intended to illustrate the importance of applying a pressure greater than 0.5 MPa during operation i) of sintering.

Example 4

The product in example 4 is manufactured according to the following process:

At operation a), the components shown in Table 2a below have been mixed to form a slip, according to the following process: the boron nitride is added to a mixture of water and tergitol, which puts them in suspension, then everything is agitated for 12 hours in a beaker, with a magnetic agitator; the Darvan 7NS is dispersed into the water; the second particulate fraction is then added, everything is then mixed for 12 hours in the rotating jar, with alumina pellets, to ensure proper deagglomeration; the alumina platelets are then added and the slip is mixed for 3 hours in a rotating jar; and finally, the Carbopol and the BN platelets in suspension are added and everything is mixed for 3 hours in a rotating jar.

TABLE 2a

| Components of example 4 | % V |
|---|---|
| First particulate fraction: RonalFlair White Sapphire powder | 9.95 |
| First particulate fraction: Très BN 3016 BN powder | 4.72 |
| Second particulate fraction: TM-DAR Taimicron alumina powder | 0.39 |
| Second particulate fraction: Nexsil 20K colloidal silica solution | 0.89 |
| Second particulate fraction: $CaCO_3$ calcium carbonate | 0.13 |
| Carbopol EDT 2691 | 0.24 |
| Darvan 7NS | 0.51 |
| Tergitol | 0.05 |
| De-ionized water | 83.12 |

Characteristics of Example 4

TABLE 2b

| | |
|---|---|
| Volume % of all the ceramic particles, based on slip volume | 15.33 |
| Volume % represented by the first particulate fraction, based on the volume of all ceramic particles | 95.7 |
| Median length $L1_{50}$ of the first particulate fraction (μm) - White Sapphire | 9 |
| Average thickness $W1_{50}$ of the first particulate fraction (μm) - White Sapphire | 0.5 |
| Median length $L1_{50}$ of the first particulate fraction (μm) - BN | 16 |
| Average thickness $W1_{50}$ of the first particulate fraction (μm) - BN | 1 |
| Volume % represented by the second particulate fraction, based on the volume of all ceramic particles | 4.3 |

TABLE 2b-continued

| | |
|---|---|
| Volume % of glass particles of the second particulate fraction, based on the volume of all ceramic particles | 1.8 |
| Volume % of ceramic particles of the second particulate fraction other than glass particles, based on the volume of all ceramic particles | 2.5 |
| Median length $D_{50}$ of glass particles of the second particulate fraction (μm) | 0.02 |
| Median length $D_{50}$ of ceramic particles that are not glass particles or glass precursors of the second particulate fraction (μm) | 0.1 |

Operations c), d) and e) are identical to those of example 2.

In operations f) and g) (consolidated into a single operation), the intermediary product in powder form is placed into an oven to undergo thermal treatment. This treatment is carried out in an atmosphere of air up to 600° C., with an increase at 50° C./h. At 600° C., the atmosphere is converted to nitrogen, to prevent oxidation of the boron nitride. The temperature is then brought up to 900° C. with a rate of increase equal to 100° C./h. The temperature is reduced at a rate equal to 300° C./h.

Operations h), i) and j) are identical to those of example 2.

Example 4 is intended to illustrate the possibility of limited alumina content in the platelets.

Example 5

For example 5, operations a), c), d), e), f) and g), identical to those of example 2 have been executed.

At operation h), a graphite matrix of a diameter equal to 150 mm is filled with powder. The powder is then pressed at ambient temperature at a pressure of 5 MPa to create a pre-form.

At operation i), the matrix is placed into an SPS H-HP D 320 oven produced by FCT Systeme GmbH. The pre-form then undergoes sintering under load, at 1500° C., for 15 minutes at a pressure equal to 40 MPa. The rate of increase to the leveling temperature is equal to 25° C./min.

Operation i) yields a sintered product of a diameter equal to 150 mm.

Characterization

The following methods of characterization have been used:

Particle dimensions, (and the data deriving from them, such as median dimensions), are determined by the following method.

Some of the particle powder is placed into suspension in ethanol, to properly disperse the particles. This suspension is then spread over a conductive medium, such as scotch carbon used in electronic imaging. At least 5 pictures are taken using a Scanning Electron Microscope (SEM), each picture of a minimum of 1280×960 pixels, without scale bar. The enlargement is determined in order for the width of the image to cover between 2 and 20 individual particles, i.e., not agglomerated. If that is not the case, it is necessary to restart with a suspension showing a lower ratio of particle volume over ethanol volume. The picture generally shows particles with thickness appearing approximately parallel to the viewing perspective.

Particle thickness W1 is then measured by analyzing said pictures using the Fiji software, tracking the lines bordering the particles, then using the software's "Analysis>Measurement" tool. The "length" column of the results table provides the average particle thickness. The pixels and length units may be matched first by using the "Set Scale" tool and measuring the number of pixels on the scale bar. The average thickness of the powder particles, W1*, is the average measured thicknesses W1.

Length L1 and width W2 of each particle are also measured.

Lengthening factor R, equal to the length of the particle divided by the width of said particle, is calculated, as is average lengthening factor Rm, from the particle powder, equal to the arithmetic average of lengthening factors R.

Platelet Orientation is Determined by the Following Method

A small bar of the product to be analyzed is cut perpendicularly to the direction of the pressure applied during sintering.

This small bar is then notched in its center to one-tenth of its thickness, bent and fractured using a hammer.

A flat fracture surface, parallel to the direction of pressing, is thus created.

A minimum of 15 pictures of said fracture surface are taken using a Scanning Electron Microscope (SEM). Each picture shows a minimum of 1280×950 pixels, without the scale bar.

The direction of orientation of the platelets is estimated by the orientation of each picture's pixels, linked to the local gradient of the level of gray, and measured using the suitable software.

The average orientation direction is the average calculated for all the pictures.

Average typical variance around the average orientation direction is equal to the average of the typical variances of the orientation directions calculated on each picture.

Absolute density is measured using helium pycnometry.

Apparent density is measured using imbibition, according to the principle of buoyancy.

Measurements of toughness Kjc and crack initiation toughness K1c are carried out at ambient temperature, as described in (for example) "*Strong, tough and stiff bioinspired ceramics from brittle components—supplementary information,*" Bouville et al., Nature Materials, Vol. 13, pages 508-514 (2014), incorporated for reference, with the following differences: the test pieces used showed dimensions equal to 3×6×36 mm³; the notch that was cut showed a depth equal to 2.7 mm; and the test carried out was a 4-point flex test.

The toughness value Kjc corresponds to toughness for a projected cracking extension in the notched axis equal to 0.3 mm.

The volume of platelets of the sintered products is estimated using the following method:

Five small bars of product to be analyzed are cut randomly.

Each small bar is then notched in its center to one-tenth of the thickness, bent and fractured using a hammer A flat fracture surface is thus created.

A minimum of 2 pictures of said fracture surface are taken using a Scanning Electron Microscope (SEM). Each picture shows a minimum of 1280×950 pixels, without the scale bar.

The surface covered by the platelets is determined on each picture.

The average of surfaces covered as determined on each picture is an estimate of the volume of platelets of the sintered product.

For elements other than nitrogen, the chemical analysis of the sintered products is measured by Inductively Coupled Plasma (ICP) for elements of a quantity not exceeding 0.5%; for the content of other elements, a bead of the product to be analyzed is created by melting the product, then chemical analysis is carried out by X-ray fluorescence.

The nitrogen content of the sintered product is typically determined by thermal conductivity, for example using a LECO Series TCU 436DR device.

Results

The results obtained are summarized in Table 3 below:

TABLE 3

| | Example | | | | |
|---|---|---|---|---|---|
| | 1* | 2* | 3* | 4* | 5 |
| Chemical analysis (% by mass) | | | | | |
| $Al_2O_3$ | 98.5 | 98.4 | 98.4 | 79.2 | 98.5 |
| $SiO_2$ | 0.86 | 0.75 | 0.75 | 0.75 | 0.74 |
| CaO | 0.14 | 0.25 | 0.25 | 0.25 | 0.16 |
| BN | — | — | — | 19.1 | — |
| Other elements | 0.5 | 0.60 | 0.60 | 0.70 | 0.6 |
| MgO | <0.1 | <0.1 | <0.1 | <0.1 | <0.1 |
| Sintered product | | | | | |
| Item width (mm) | 20 | 80 | 80 | 80 | 150 |
| Relative density (%) | 98.8 | 97.9 | 55.7 | 94.7 | 97.7 |
| Stacking of platelets | Yes | Yes | Yes | Yes | Yes |
| More than 80% of the volume of sintered product consists of platelets | Yes | Yes | Yes | Yes | Yes |
| Average typical variance around average direction of orientation (°) | 15 | 16.8 | n.d. | 18 | 15.4 |
| Average platelet thickness (μm) | ≤3 | ≤3 | ≤3 | ≤3 | ≤3 |
| crack initiation toughness K1c ($MPa \cdot m^{1/2}$) | 6.2 | 6.3 | n.d. | 3.8 | 6.4 |
| $K_{jc}$ ($MPa \cdot m^{1/2}$) | 7.9 | 9.6 | n.d. | 8.1 | 9.5 | n.d.: not determined
*comparative sample

The process for example 1 yields a product with high density, toughness K1c and toughness $K_{jc}$, equal to 98.8%, 6.2 $MPa \cdot m^{1/2}$ and 7.9 $MPa \cdot m^{1/2}$, respectively. The width of this product, however, is necessarily less than 50 mm.

The process for example 2 yields a product presenting high density, toughness K1c and toughness $K_{jc}$, equal to 97.9%, 6.3 $MPa \cdot m^{1/2}$ and 9.6 $MPa \cdot m^{1/2}$, respectively. Effectively, the width of this product is 80 mm.

The process for example 3 yields a product of a width equal to 80 mm. The lack of application of a pressure higher than 0.5 MPa during operation i) of sintering leads, however, to a much lower density than that of example 1, of 55.7%.

The process for example 4 yields a product of a width equal to 80 mm presenting a density equal to 94.7%, and not presenting fragile behavior, the value of Kjc being greater than the value of K1c, these values being 8.1 $MPa \cdot m^{1/2}$ and 3.8 $MPa \cdot m^{1/2}$ respectively.

The process in example 5 yields a product of a high density, toughness K1c and toughness Kjc equal to 97.7%, 6.4 $MPa \cdot m^{1/2}$ and 9.5 $MPa \cdot m^{1/2}$, respectively. Effectively, the width of this product is equal to 150 mm.

As now clearly shown, embodiments described herein provide processes that allow for manufacturing of a remarkably dense sintered product, which is not fragile, presenting large dimensions, as well as such sintered products themselves. Such processes, which combine the preparation of a specific powder, freezing/thawing activities and sintering under pressure, is effectively simple to implement.

Of course, embodiments are not limited to the execution methods described and represented above, which are offered as examples. Further, embodiments are not limited by the shape of the products, nor by their use.

The invention claimed is:

1. An electronic device housing comprising a product, the product comprising:
   $Al_2O_3$;
   greater than 0.75% by mass and less than 2% by mass $SiO_2$;
   greater than 0.55% by mass and less than 1.5% by mass CaO;
   less than 0.3% by mass MgO;
   the $Al_2O_3$, $SiO_2$, CaO, and MgO comprising at least 98.5% by mass of the product;
   the product having a relative density greater than 90%, and greater than 90% by volume of the product comprising substantially parallel ceramic platelets having an average length greater than 5 μm and a thickness less than 3 μm and ceramic particles having an average length less than 1 μm, the ceramic particles comprising less than 7% by volume of the ceramic platelets and the ceramic particles.

2. The electronic device housing of claim 1, wherein the product has:
   a crack initiation toughness K1c greater than 5.5 $MPa \cdot m^{1/2}$;
   a toughness Kjc greater than 7 $MPa \cdot m^{1/2}$;
   a relative density greater than 95%; and
   a width greater than 100 mm.

3. The electronic device housing of claim 1, wherein the product has:
   a crack initiation toughness K1c greater than 6 $MPa \cdot m^{1/2}$,
   a toughness Kjc greater than 8 $MPa \cdot m^{1/2}$;
   a relative density greater than 98%; and
   a width greater than 150 mm.

4. The electronic device housing of claim 1, wherein more than 90% by number of the ceramic platelets have a length of less than 70 μm.

5. The electronic device housing of claim 1, wherein:
   the product comprises less than 1.5% by mass $SiO_2$;
   the sum of CaO and MgO comprise greater than 0.1% by mass and less than 0.8% by mass of the product; and
   the $Al_2O_3$, $SiO_2$, CaO, and MgO comprise at least 99.2% by mass of the product.

6. The electronic device housing of claim 1, wherein the sintered product has a width, as measured in a direction parallel to a plane of the substantially parallel ceramic platelets, greater than 60 mm.

7. The electronic device housing of claim 6, wherein the width is greater than 100 mm.

8. The electronic device housing of claim 1, wherein the sintered product further comprises greater than 1% by mass being in the form of platelets.

9. The electronic device housing of claim 1, wherein the average length of the ceramic particles is at least 10 times less than the average length of the ceramic platelets.

10. The electronic device housing of claim 1, wherein the ceramic particles is greater than 2% by volume of the ceramic platelets and ceramic particles.

11. An electronic device housing comprising a sintered product, the sintered product comprising:

$Al_2O_3$;

greater than 0.2% by mass and less than 2% by mass $SiO_2$;

greater than 0.1% by mass and less than 1.5% by mass CaO;

less than 0.3% by mass MgO;

the $Al_2O_3$, $SiO_2$, CaO, and MgO comprising at least 98.5% by mass of the sintered product;

the sintered product having a relative density greater than 90%, and greater than 90% by volume of the sintered product comprising substantially parallel ceramic platelets having an average length greater than 5 μm and a thickness less than 3 μm and ceramic particles having an average length less than 1 μm, the ceramic particles comprising less than 7% by volume of the ceramic platelets and the ceramic particles; and wherein the sintered product has a width, as measured in a direction parallel to a plane of the substantially parallel ceramic platelets, greater than 60 mm.

\* \* \* \* \*